United States Patent
Naya

(10) Patent No.: US 6,707,538 B2
(45) Date of Patent: Mar. 16, 2004

(54) NEAR-FIELD EXPOSURE SYSTEM SELECTIVELY APPLYING LINEARLY POLARIZED EXPOSURE LIGHT TO EXPOSURE MASK

(75) Inventor: Masayuki Naya, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 51 days.

(21) Appl. No.: 10/170,386

(22) Filed: Jun. 14, 2002

(65) Prior Publication Data

US 2002/0196420 A1 Dec. 26, 2002

(30) Foreign Application Priority Data

Jun. 21, 2001 (JP) .......................... 2001/188219

(51) Int. Cl.[7] .................. G03B 27/72; G03B 27/42; G03B 27/02
(52) U.S. Cl. ............... 355/71; 355/53; 355/78
(58) Field of Search ................ 355/53, 71, 78–79, 355/85; 250/548

(56) References Cited

U.S. PATENT DOCUMENTS 4,656,347 A * 4/1987 Une et al. .................. 250/201
6,497,996 B1 * 12/2002 Naya et al. ................. 430/323
2002/0180941 A1 * 12/2002 Hansen ........................ 355/53

FOREIGN PATENT DOCUMENTS

| EP | 1 054 296 | 11/2000 |
|---|---|---|
| JP | 2000-112116 | 4/2000 |
| JP | 2001-15427 | 1/2001 |

* cited by examiner

Primary Examiner—Henry Hung Nguyen
(74) Attorney, Agent, or Firm—Sughrue Mion, PLLC

(57) ABSTRACT

In a near-field exposure system: a light source emits exposure light having a predetermined wavelength and being unpolarized; a polarizer plate linearly polarizes the exposure light; an exposure mask which has a pattern of openings each having a dimension smaller than the wavelength of the exposure light is placed at such a position that the exposure light is applied to the exposure mask; an exposure table holds a photosensitive material sensitive to the exposure light, at a position which near-field light emerging from the openings reaches; and a polarizer-plate holding device holds the polarizer plate in such a manner that the polarizer plate can be moved between first and second positions, where the first position is in an optical path of the exposure light from the light source to the exposure mask, and the second position is outside the optical path.

9 Claims, 3 Drawing Sheets

NEAR-FIELD EXPOSURE SYSTEM SELECTIVELY APPLYING LINEARLY POLARIZED EXPOSURE LIGHT TO EXPOSURE MASK

CROSS-REFERENCE TO RELATED APPLICATIONS

The subject matters disclosed in this specification are related to the subject matters disclosed in the copending, commonly-assigned U.S. patent application Ser. No. 09/562,076 filed by Masayuki Naya (the inventor of the present application) and Shinji Sakaguchi on May 1, 2000 and entitled "FINE PATTERN FORMING METHOD," corresponding to Japanese patent application No. 2000-119670, which is disclosed in Japanese Unexamined Patent Publication No. 2001-15427.

The contents of the above copending, commonly-assigned U.S. patent application and the corresponding Japanese patent application are incorporated in this specification by reference.

BACKGROUND OF THE INVENTION

1. Field of the Invention

The present invention relates to a near-field exposure system which exposes a fine pattern on a photosensitive material such as a photoresist.

2. Description of the Related Art

The development in the photolithographic technology has been supported by the development in the reduction-projection exposure technology and the resist technology. In the reduction-projection exposure technology, performance is mainly determined by two fundamental quantities, the resolution RP and the focal depth DOP, which are respectively expressed as $RP=k_1 \lambda/NA$ and $DOP=k_2 \lambda/NA^2$, where $\lambda$ is an exposure wavelength of a projection optical system, NA is a numerical aperture of a projection lens, and $k_1$ and $k_2$ are coefficients. In order to increase the resolution in lithography, it is important to reduce the wavelength $\lambda$ and increase the numerical aperture NA of the projection lens. Although the resolution is improved with increase in the numerical aperture NA, the focal depth DOP is reduced in inverse proportion to the square of the numerical aperture NA. Therefore, currently, the reduction in the wavelength $\lambda$ is required for realizing fine lithography. Thus, the exposure light used in lithography has been changed from the g line having the wavelength of 436 nm to the i line having the wavelength of 365 nm, and currently use of the excimer laser light having the wavelength of 248 or 193 nm is becoming mainstream.

However, in the lithography using light, the resolution limit is the diffraction limit of the exposure light. Therefore, it is said that the finest line width obtained by use of the excimer laser light having the wavelength of 248 or 193 nm and a lens-series optical system is 100 nm. Further, in order to achieve a resolution of the nanometer order, it is necessary to use an electron-beam or X-ray lithography technique. In particular, the synchrotron orbital radiations (SORs) are used in the X-ray lithography.

The electron-beam lithography enables highly precise control for forming a pattern including nanometer-scale structures. In addition, the electron-beam lithography can achieve a considerably greater focal depth than the lithography using an optical system. Further, the electron-beam lithography enables direct drawing on a wafer without use of a mask. However, because of low throughput and high cost, the current electron-beam lithographic techniques are far from the level which enables mass production.

On the other hand, the X-ray lithography can achieve about one order of magnitude higher resolution and precision than the excimer laser exposure either when 1:1 projection exposure through a 1:1 mask is used, or when a reflective imaging X-ray optical system is used. However, it is not easy to realize the X-ray lithography since production of masks is not easy. In addition, equipment cost is high.

In order to solve the above problems, a method for exposing a photosensitive material such as a photoresist to near-field light has been proposed. In this method, exposure light is applied to an exposure mask in which a pattern of openings having dimensions smaller than the wavelength of the exposure light is formed, so that near-field light emerges through the openings of the exposure mask, and the photosensitive material is exposed to the near-field light. According to the above method, a fine pattern of the same order of magnitude as the openings in the exposure mask can be formed in the photosensitive material regardless of the wavelength of the exposure light. An example of an exposure system executing the above method is disclosed in Japanese Unexamined Patent Publication No. 2000-112116.

It is known that when a fine pattern in an exposure mask is transferred to a photosensitive material such as a photoresist by exposure to near-field light as above, and the fine pattern is constituted by straight lines extending in an identical direction as in the case of a diffraction grating, and the exposure light is linearly polarized in the same direction as the direction of the straight lines, thickening of straight lines formed on the photosensitive material can be prevented so that a finer pattern can be formed on the photosensitive material.

Based on the above knowledge, JUPP No. 2000-112116 discloses a near-field exposure mask in which an opening pattern and a grid polarizer are stacked on a mask substrate, where the opening pattern has dimensions smaller than the wavelength of exposure light, and the grid polarizer polarizes light in a direction parallel to the direction of the openings constituting the opening pattern.

However, when a polarizer is produced for each exposure mask as above, the exposure mask becomes expensive, and thus the cost of fine pattern exposure increases.

SUMMARY OF THE INVENTION

An object of the present invention is to provide a near-field exposure system which can expose a photosensitive material such as a photoresist to near-field light so as to form a fine pattern including thin linear portions, and suppress the cost of the exposure.

(1) According to the first aspect of the present invention, there is provided a near-field exposure system comprising: a light source which emits exposure light having a predetermined wavelength and being unpolarized; a polarizer plate which linearly polarizes the exposure light; an exposure mask which has a pattern of openings each having a dimension smaller than the wavelength of the exposure light, and is placed at such a position that the exposure light is applied to the exposure mask; an exposure table which holds a photosensitive material sensitive to the exposure light, at a position which near-field light emerging from the openings reaches; and a polarizer-plate holding means which holds the polarizer plate in such a manner that the polarizer plate can be moved between first and second positions, where the first position is in an optical path of the exposure light from the light source to the exposure mask, and the second position is outside the optical path.

The near-field exposure system according to the first aspect of the present invention may also have one or any possible combination of the following additional features (i) to (iv).

(i) The polarizer-plate holding means may hold the polarizer plate in such a manner that the polarizer plate can be rotated and directed to a direction in which polarizer plate linearly polarizes the exposure light.

(ii) The near-field exposure system the first aspect of the present invention may further comprise an indication means for indicating a direction in which the polarizer plate linearly polarizes the exposure light. For example, the indication means is an arrow indication provided on the polarizer plate.

(iii) The exposure light which is applied to the exposure mask may have a first component which is linearly polarized in a desired direction and a second component which is linearly polarized in a direction perpendicular to the desired direction, and a ratio of the second component to the first component may be 25% or smaller.

(iv) In the near-field exposure system having the above feature (iii), the ratio may be 15% or smaller.

(2) The advantages of the near-field exposure system according to the first aspect of the present invention are explained below.

The near-field exposure system according to the first aspect of the present invention comprises the polarizer-plate holding means, so that the polarizer plate which linearly polarizes the exposure light can be moved between the first position in the optical path of the exposure light from the light source to the exposure mask and the second position outside the optical path. That is, the polarizer plate can be selectively inserted in the optical path to the exposure mask.

In the case where the exposure mask has an opening pattern constituted by only lines extending in an identical direction, thickening of lines formed on the photosensitive material can be prevented when the exposure mask is placed in an optical path of the linearly polarized exposure light in such a manner that the direction of the lines constituting the opening pattern is identical to the direction of the linear polarization of the linearly polarized exposure light. That is, a fine pattern constituted by lines having small widths can be formed on the photosensitive material by the exposure when the exposure light is linearly polarized by insertion of the polarizer plate in the optical path, and coincidence between the direction of the lines constituting the opening pattern in the exposure mask and the direction of the linear polarization is achieved.

The coincidence between the direction of the lines constituting the opening pattern in the exposure mask and the direction of the linear polarization can be achieved, for example, by changing the direction of the exposure table on which the photosensitive material is held, or adjusting the direction of the photosensitive material held on the exposure table. Alternatively, in the case where the polarizer-plate holding means holds the polarizer plate in such a manner that the polarizer plate can be rotated, the direction of the linear polarization can be easily adjusted to the direction of the lines constituting the opening pattern in the exposure mask by rotating the polarizer plate.

In addition, in the case where the indication means for indicating the direction in which the polarizer plate linearly polarizes the exposure light is provided, the user can visually confirm the direction of the linear polarization in the operation for achieving the coincidence between the direction of the lines constituting the opening pattern in the exposure mask and the direction of the linear polarization. Therefore, the operation for achieving the coincidence between the above directions becomes further easier.

Further, investigations made by the present inventor have revealed that a pattern formed on a photosensitive material by exposure to linearly polarized exposure light is likely to be deformed to an elliptic shape when the linearly polarized exposure light is applied to the photosensitive material through a photomask having a circular opening pattern. Therefore, in the case where a photomask having a circular opening pattern or the like is used, a circular pattern which is similar to the circular opening pattern in the exposure mask can be accurately formed on a photoresist material by placing the polarizer plate at the aforementioned second position outside the optical path and applying the unpolarized exposure light to the exposure mask.

(3) According to the second aspect of the present invention, there is provided a near-field exposure system comprising: a light source which emits exposure light having a predetermined wavelength and being linearly polarized; a phase plate which circularly or elliptically polarizes the exposure light; an exposure mask which has a pattern of openings each having a dimension smaller than the wavelength of the exposure light, and is placed at such a position that the exposure light is applied to the exposure mask; an exposure table which holds a photosensitive material sensitive to the exposure light, at a position which near-field light emerging from the openings reaches; and a phase-plate holding means which holds the phase plate in such a manner that the phase plate can be moved between first and second positions, where the first position is in an optical path of the exposure light from the light source to the exposure mask, and the second position is outside the optical path.

The near-field exposure system according to the second aspect of the present invention may also have one or any possible combination of the following additional features (i) to (iii).

(i) The near-field exposure system according to the second aspect of the present invention may further comprise an indication means for indicating a direction in which the exposure light emitted by the light source is linearly polarized.

(ii) The exposure light which is applied to the exposure mask may have a first component which is linearly polarized in a desired direction and a second component which is linearly polarized in a direction perpendicular to the desired direction, and the ratio of the second component to the first component may be 25% or smaller.

(iii) In the near-field exposure system having the above feature (ii), the ratio may be 15% or smaller.

(4) The advantages of the near-field exposure system according to the second aspect of the present invention are explained below.

The near-field exposure system as the second aspect of the present invention comprises a phase-plate holding means, so that the phase plate which circularly or elliptically polarizes the linearly polarized exposure light can be moved between the first position in the optical path of the exposure light from the light source to the exposure mask and the second position outside the optical path. That is, the phase plate can be selectively inserted in the optical path of the exposure light to the exposure mask.

In the case where the exposure mask has an opening pattern constituted by only lines extending in an identical direction, a fine pattern constituted by lines having small widths can be formed on a photosensitive material by placing the phase plate outside the optical path, achieving coincidence between the direction of the lines constituting the opening pattern in the exposure mask and the direction of the linear polarization, and applying the linearly polarized exposure light to the exposure mask.

The coincidence between the direction of the lines constituting the opening pattern in the exposure mask and the direction of the linear polarization can be achieved, for example, by changing the direction of the exposure table on which the photosensitive material is held, or adjusting the direction of the photosensitive material held on the exposure table.

In addition, in the case where the indication means for indicating a direction in which the exposure light emitted by the light source is linearly polarized is provided, the user can visually confirm the direction of the linear polarization in the operation for achieving the coincidence between the direction of the lines constituting the opening pattern in the exposure mask and the direction of the linear polarization. Therefore, the operation for achieving the coincidence between the above directions becomes further easier.

Further, in the case where a photomask having a circular opening pattern is used, a circular pattern which is similar to the circular opening pattern in the exposure mask can be accurately formed on a photoresist material by inserting the phase plate in the optical path of the exposure light to the exposure mask and applying the circularly or elliptically polarized exposure light to the exposure mask.

(5) The advantages of the near-field exposure systems according to the first and second aspects of the present invention having the additional features indicated in paragraphs (1) (iii), (1) (iv), (3) (ii), and (3)(iii) are explained below.

When the ratio of the component of the exposure light which reaches the exposure mask and is linearly polarized in a desired direction (i.e., the component linearly polarized in the direction identical to the direction of the lines constituting the exposure mask) to the component of the exposure light which reaches the exposure mask and is linearly polarized in a direction perpendicular to the desired direction is 25% or smaller, thickening of lines formed by exposure (i.e., the ratio of the increase over the mask pattern line width to the mask pattern line width) can be suppressed to 50% or less. When the thickening of lines formed on a photosensitive material based on a mask pattern having a line-and-space ratio of 1:1 is 50% or less, adjacent lines formed on the photosensitive material do not overlap.

Further, when the ratio of the component of the exposure light which reaches the exposure mask and is linearly polarized in a desired direction to the component of the exposure light which reaches the exposure mask and is linearly polarized in a direction perpendicular to the desired direction is 15% or smaller, the thickening of lines formed by exposure can be suppressed to 30% or less. It is said that the thickening of 30% or less is preferable for obtaining a very fine pattern constituted by lines formed by exposure.

DESCRIPTION OF PREFERRED EMBODIMENTS

Embodiments of the present invention are explained in detail below with reference to drawings.

Construction of First Embodiment

Figure 1:
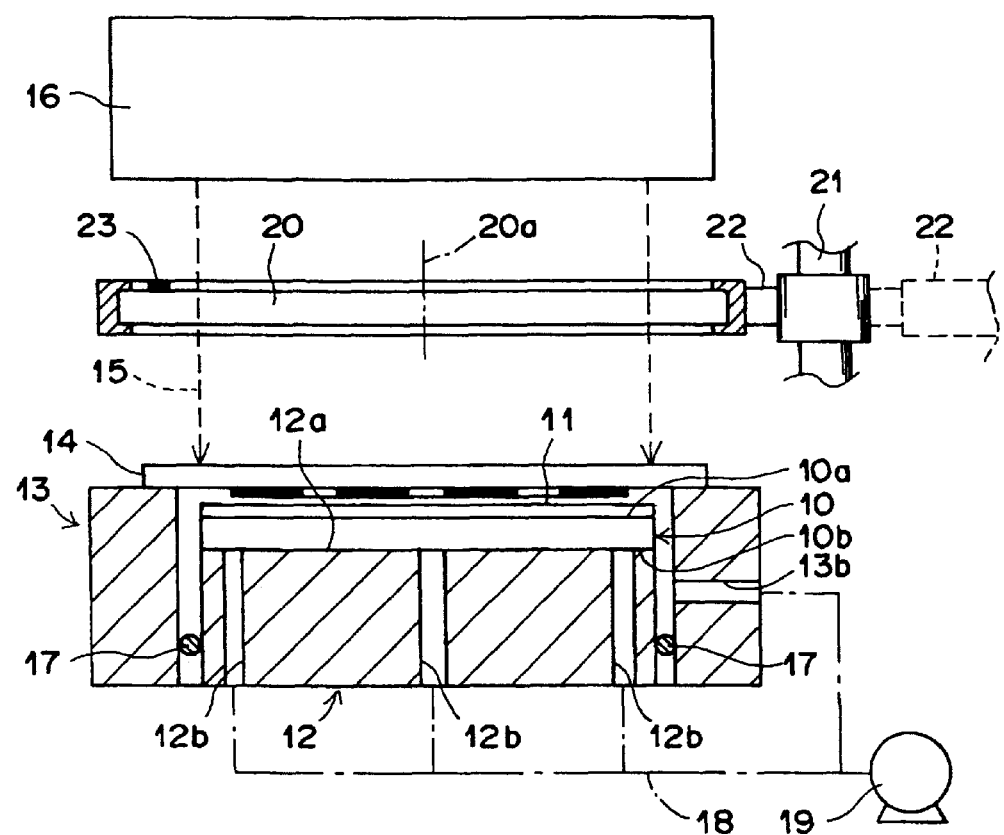
FIG. 1 is a side view, partly in cross section, of a near-field exposure system as a first embodiment of the present invention in a first state.

FIG. 1 is a side view, partly in cross section, of a near-field exposure system as the first embodiment of the present invention in a first state. As illustrated in FIG. 1, the near-field exposure system as the first embodiment comprises a substrate 10, an exposure table 12, a photomask holding member 13, a photomask (exposure mask) 14, and an exposure light source 16.

A photoresist 11 is applied to a surface 10a of the substrate 10. The exposure table 12 has a nearly cylindrical shape, and the substrate 10 is held by the exposure table 12 so that the back surface 10b of the substrate 10 is in contact with the exposure table 12. The photomask holding member 13 is arranged to contain the exposure table 12. The photomask 14 is placed on the photomask holding member 13. The exposure light source emits exposure light 15, which is applied to photoresist 11 through the photomask 14.

The exposure light 15 emitted by the exposure light source 16 is unpolarized and has a wavelength of about 400 nm or longer. For example, the exposure light is g-line light (having the wavelength of 436 nm).

Figure 3:
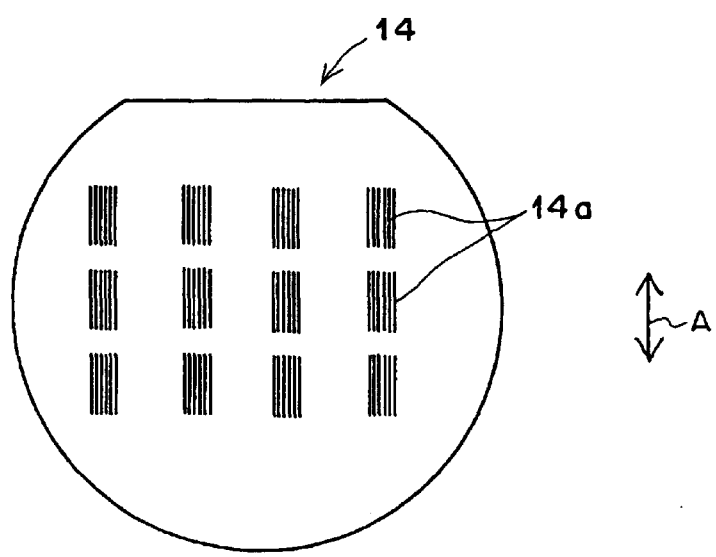
FIG. 3 is a plan view of an example of a photomask used in the near-field exposure system of FIG. 1.

The photomask 14 is designed for near-field exposure. That is, the photomask 14 has a pattern of openings 14a having widths smaller than the wavelength of the exposure light 15 so that near-field light emerges from the openings 14a when the exposure light 15 is applied to the photomask 14. In particular, the photomask 14 in the first embodiment is designed for forming a plurality of diffraction grating patterns on the photoresist 11, as illustrated in FIG. 3, which is a plan view of an example of a photomask used in the near-field exposure system of FIG. 1. Specifically, all of the openings 14a have a linear shape and extend in the direction of the arrow A indicated in FIG. 3, and the plurality of diffraction grating patterns are each formed with a group of openings. In FIG. 1, the photomask 14 is placed on the photomask holding member 13 so that the arrow A is perpendicular to the plane of the figure.

The upper surface of the exposure table 12 is a substrate holding surface 12a, and the substrate 10 is placed in contact with the substrate holding surface 12a. In addition, a plurality of ventilation paths 12b are provided in the center and a plurality of near-edge positions of the exposure table 12 so that each of the plurality of ventilation paths 12b passes through the thickness of the exposure table 12 in the vertical direction.

Further, a sealing member 17 is arranged around the exposure table 12 so as to be interposed between the exposure table 12 and the photomask holding member 13. That is, the space between the exposure table 12 and the photomask holding member 13 is separated by the sealing member 17 into upper and lower spaces. In addition, the photomask holding member 13 has a ventilation path 13b at an elevation above the sealing member 17, and the ventilation path 13b passes through the photomask holding member 13 in the horizontal direction.

The ventilation paths 12b and 13b are connected through pipes 18 to an air suction means 19 such as a vacuum pump. The air suction means 19, the pipes 18, and the photomask holding member 13 realize a means for bringing the photomask 14 close to the photoresist 11 and pressing the photomask 14 on the photoresist 11.

A polarizer disk 20 can be inserted in the optical path of the exposure light 15 from the exposure light source 16 to the photomask 14. Specifically, the polarizer disk 20 is held by a polarizer-disk holding means 22, which can move the polarizer disk 20 around a rotation axis 21 and fix the polarizer disk 20 at a position in the optical path of the exposure light 15 as illustrated with solid lines in FIG. 1 or another position outside the optical path as illustrated with dashed lines in FIG. 1.

In addition, the polarizer disk 20 is held by a polarizer-disk holding means 22 in such a manner that the polarizer disk 20 per se can be rotated around the center axis 20a of the polarizer disk 20. Further, an indication 23 of the direction of the linear polarization of the exposure light which passes through the polarizer disk 20 is provided on a near-edge area of the upper surface of the polarizer disk 20. For example, the indication 23 is an arrow indication.

Operations of First Embodiment

The operations of the near-field exposure system as the first embodiment of the present invention are explained below.

The substrate 10 is placed on the exposure table 12 so that the back surface 10b of the substrate 10 is in contact with the substrate holding surface 12a, where the photoresist 11 is applied on the upper surface 10a of the substrate 10. In addition, the photomask 14 which has the aforementioned pattern is placed on the photomask holding member 13. At this time, the polarizer disk 20 is inserted in the optical path of the exposure light 15. This situation is illustrated in FIG. 1.

Figure 2:
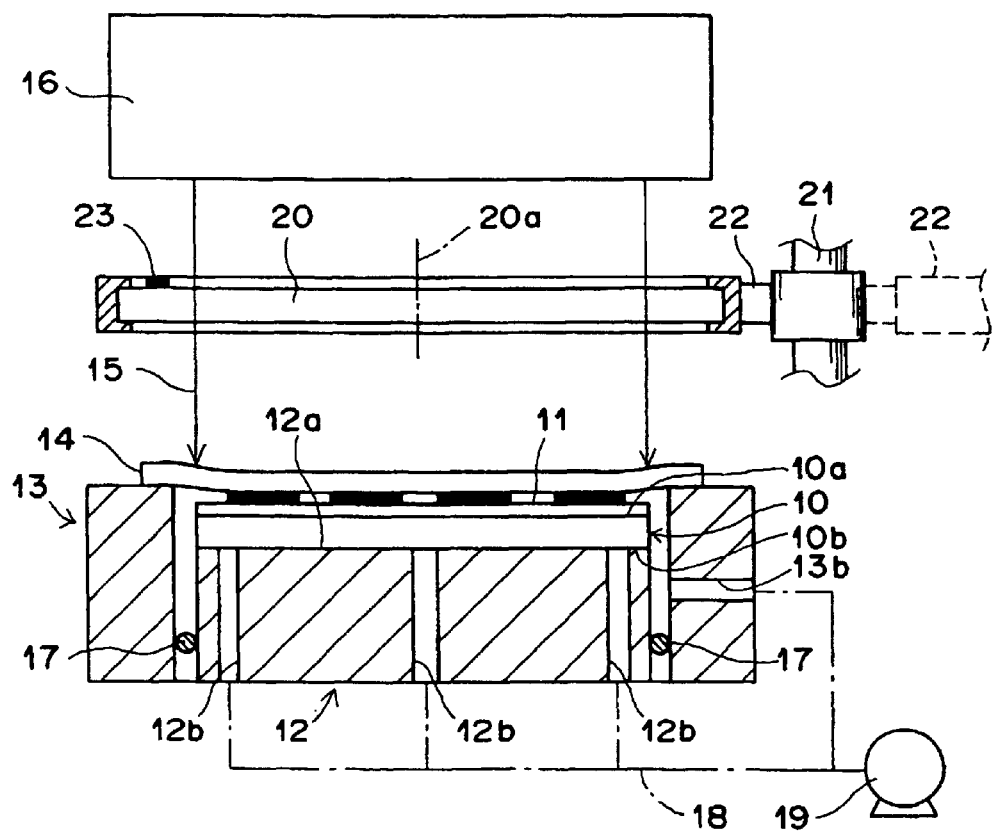
FIG. 2 is a side view, partly in cross section, of a near-field exposure system as the first embodiment of the present invention in a second state.

When the air suction means 19 is activated, air is sucked by the air suction means 19 from the plurality of ventilation paths 12b so that vacuum evacuation is achieved in the plurality of ventilation paths 12b, and the substrate 10 comes in contact with the substrate holding surface 12a of the exposure table 12 and is held by the exposure table 12. At the same time, air is also sucked from the ventilation path 13b of the photomask holding member 13 so that vacuum evacuation is also achieved in the space formed inside the photomask holding member 13 between the photomask 14 and the sealing member 17, and the photomask 14 is warped onto the photoresist 11 applied on the substrate 10, i.e., the photomask 14 comes in contact with the photoresist 11, as illustrated in FIG. 2.

When the exposure light source 16 is activated in the above situation, the exposure light 15 is applied to the photoresist 11 through the photomask 14, and the photoresist 11 is exposed to near-field light. That is, near-field light emerges from the openings 14a having the dimensions smaller than the wavelength of the exposure light 15 (as illustrated in FIG. 3), and fine diffraction grating patterns corresponding to the openings 14a are formed on the photoresist 11 by the exposure, i.e., the pattern constituted by the openings 14a is transferred to the photoresist 11 by the exposure.

The photoresist 11 is a positive or negative photoresist. Only portions of the positive photoresist which are exposed to the near-field light become soluble in a developer solution, and only portions of the negative photoresist which are not exposed to the near-field light become soluble in a developer solution. Therefore, when the photoresist 11 undergoes a developing process after the exposure, and etching processing is performed on the substrate 10 by using the developed photoresist 11, a plurality of diffraction gratings are formed on the substrate 10.

At the time of the exposure of the photoresist 11, the user can manually set the polarizer-disk holding means 22 so that the polarizer disk 20 is inserted in the optical path of the exposure light 15. Thus, the exposure light 15 applied to the photomask 14 is linearly polarized by the polarizer disk 20. In addition, the user can set the rotational position of the polarizer disk 20 so that the direction of the linear polarization of the exposure light 15 coincides with the direction of the linearly shaped openings 14a, for example, by referring to the indication 23. In this case, the exposure light 15 which is applied to the photomask 14 is linearly polarized in the same direction as the linearly shaped openings 14a. Therefore, it is possible to prevent thickening of the lines of the patterns formed in the photoresist 11 by the exposure, and form fine diffraction grating patterns having small line widths by the exposure.

For the reason explained before, the ratio of the component of the exposure light 15 which is applied to the photomask 14 and linearly polarized in the direction perpendicular to the linearly shaped openings 14a to the component of the exposure light 15 which is applied to the photomask 14 and linearly polarized in the same direction as the linearly shaped openings 14a is preferably 25% or smaller, and more preferably 15% or smaller.

The above photoresist 11 may be a conventional photoresist comprised of a single layer. Alternatively, the photoresist 11 may be the two-layer photoresist disclosed in the copending, commonly-assigned U.S. patent application Ser. No. 09/562,076 and the corresponding Japanese patent application No. 2000-119670 (which is laid open in Japanese Unexamined Patent Publication No. 2001-15427).

The patterns which can be formed by the near-field exposure system as the first embodiment of the present invention are not limited to diffraction grating patterns. When an opening pattern is not constituted by only lines extending in an identical direction, e.g., when the opening pattern is a circular pattern or a pattern constituted by lines extending in more than one direction, the polarizer disk 20 is set in the position outside the optical path of the exposure light 15. That is, the exposure light 15 which is applied to the photomask 14 is unpolarized.

If linearly polarized exposure light is applied to a photomask having a circular pattern, a pattern formed on the photoresist 11 by the exposure may have an elliptic shape. On the other hand, if linearly polarized exposure light is applied to a photomask having a pattern constituted by lines extending in more than one direction, lines formed on the photoresist 11 may be differently thickened depending on the directions of the lines. Therefore, when the exposure light 15 which is applied to the photoresist 11 is unpolarized, it is possible to prevent occurrence of the above problems, and form a fine pattern by exposure.

Alternatively, it is possible to move the polarizer-disk holding means 22 by using an actuator, instead of manually moving the polarizer-disk holding means 22. The actuator may be any type. In addition, it is also possible to rotate the polarizer disk 20 by using an actuator.

Second Embodiment

Figure 4:
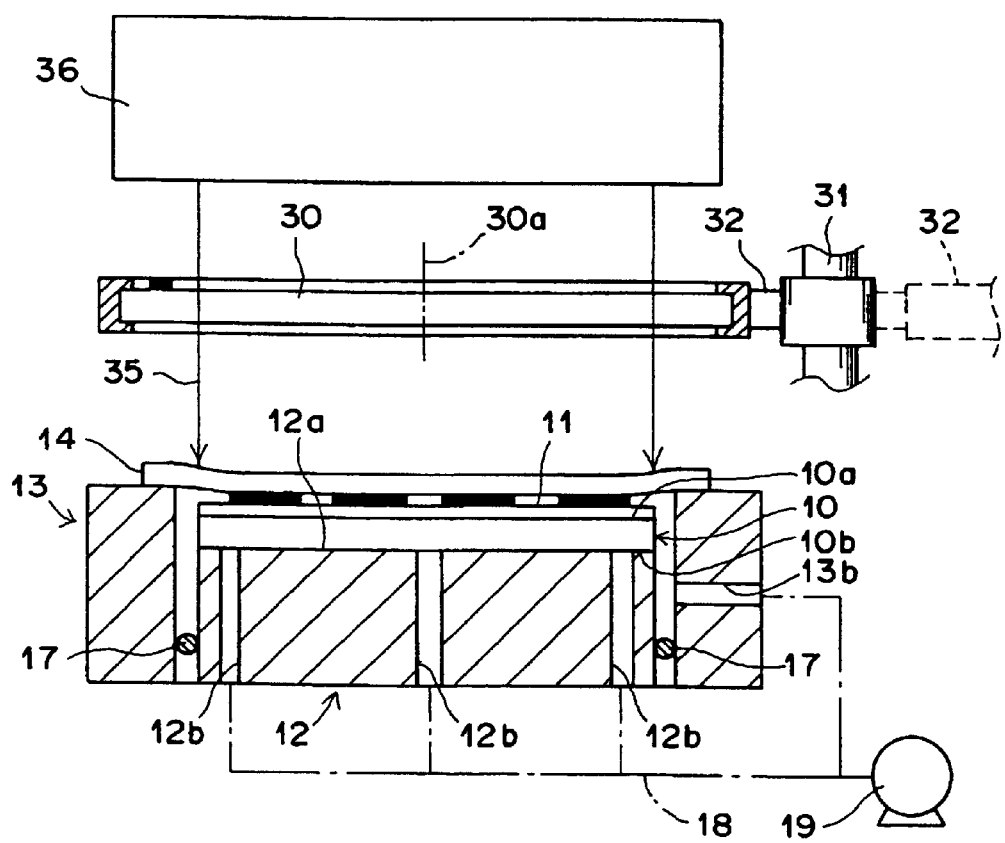
FIG. 4 is a side view, partly in cross section, of a near-field exposure system as a second embodiment of the present invention.

FIG. 4 is a side view, partly in cross section, of a near-field exposure system as the second embodiment of the present invention. In FIG. 4, elements having the same functions as the elements in the near-field exposure system illustrated in FIG. 1 bear the same reference numerals as FIG. 1, respectively, and only the differences from the construction of FIG. 1 are explained below.

The near-field exposure system as the second embodiment is essentially different from the first embodiment in that the exposure light source 36 emits linearly polarized exposure light 35, and a quarter-wavelength plate 30 (as a phase plate) is provided instead of the polarizer disk 20. For example, the exposure light 35 may be laser light.

The quarter-wavelength plate 30 can be inserted in the optical path of the exposure light 35 from the exposure light source 36 to the photomask 14. Specifically, the quarter-wavelength plate 30 is held by a polarizer-disk holding means 32, which can move the quarter-wavelength plate 30 around a rotation axis 31 and fix the quarter-wavelength plate 30 at a position in the optical path of the exposure light 35 as illustrated with solid lines in FIG. 4 or another position outside the optical path as illustrated with dashed lines in FIG. 4.

When the photomask 14 has a pattern constituted by linear openings 14a as illustrated in FIG. 3, the user manually sets the polarizer-disk holding means 32 so that the quarter-wavelength plate 30 is outside the optical path of the exposure light 35. Therefore, the linearly polarized exposure light 35 is applied to the photomask 14. At this time, the user can adjust the direction of the linearly shaped openings 14a in the photomask 14 to the direction of the linear polarization of the exposure light 35, for example, by adjusting the rotational position of the photomask 14. Thus, it is possible to prevent thickening of the lines of the patterns formed in the photoresist 11 by the exposure, and form fine diffraction grating patterns having small line widths by the exposure.

The patterns which can be formed by the near-field exposure system as the second embodiment of the present invention are also not limited to diffraction grating patterns. When an opening pattern is not constituted by only lines extending in an identical direction, e.g., when the opening pattern is a circular pattern or a pattern constituted by lines extending in more than one direction, the quarter-wavelength plate 30 is set in the optical path of the exposure light 35 from the exposure light source 36 to the photomask 14. That is, the exposure light 35 which is applied to the photomask 14 is circularly polarized.

As explained before, if linearly polarized exposure light is applied to a photomask having a circular pattern or a pattern constituted by lines extending in more than one direction, a pattern formed on the photoresist 11 by the exposure may have an elliptic shape, or lines formed on the photoresist 11 may be differently thickened depending on the directions of the lines. On the other hand, when the exposure light 35 which is applied to the above photomask is circularly polarized, it is possible to prevent occurrence of the above problems, and form a fine pattern by exposure.

Alternatively, a phase plate which converts the linearly polarized exposure light 35 into elliptically polarized exposure light can be used instead of the quarter-wavelength plate 30. The near-field exposure system having such a phase plate has similar advantages to the near-field exposure system having the quarter-wavelength plate 30.

What is claimed is:

1. A near-field exposure system comprising:
   a light source which emits exposure light having a predetermined wavelength and being unpolarized;
   a polarizer plate which linearly polarizes said exposure light;
   an exposure mask which has a pattern of openings each having a dimension smaller than the wavelength of the exposure light, and is placed at such a position that said exposure light is applied to the exposure mask;
   an exposure table which holds a photosensitive material sensitive to said exposure light, at a position which near-field light emerging from the openings reaches; and
   a polarizer-plate holding means which holds said polarizer plate in such a manner that the polarizer plate can be moved between first and second positions, where the first position is in an optical path of said exposure light from the light source to the exposure mask, and the second position is outside the optical path.

2. A near-field exposure system according to claim 1, wherein said polarizer-plate holding means holds said polarizer plate in such a manner that the polarizer plate can be rotated and directed to a direction in which polarizer plate linearly polarizes said exposure light.

3. A near-field exposure system according to claim 1, further comprising an indication means for indicating a direction in which said polarizer plate linearly polarizes said exposure light.

4. A near-field exposure system according to claim 1, wherein said exposure light which is applied to the exposure mask has a first component which is linearly polarized in a desired direction and a second component which is linearly polarized in a direction perpendicular to the desired direction, and a ratio of the second component to the first component is 25% or smaller.

5. A near-field exposure system according to claim 4, wherein said ratio is 15% or smaller.

6. A near-field exposure system comprising:
   a light source which emits exposure light having a predetermined wavelength and being linearly polarized;
   a phase plate which circularly or elliptically polarizes said exposure light;
   an exposure mask which has a pattern of openings each having a dimension smaller than the wavelength of the exposure light, and is placed at such a position that said exposure light is applied to the exposure mask;
   an exposure table which holds a photosensitive material sensitive to said exposure light, at a position which near-field light emerging from the openings reaches; and
   a phase-plate holding means which holds said phase plate in such a manner that the phase plate can be moved between first and second positions, where the first position is in an optical path of said exposure light from the light source to the exposure mask, and the second position is outside the optical path.

7. A near-field exposure system according to claim 6, further comprising an indication means for indicating a direction in which said exposure light emitted by the light source is linearly polarized.

8. A near-field exposure system according to claim 6, wherein said exposure light which is applied to the exposure mask has a first component which is linearly polarized in a desired direction and a second component which is linearly polarized in a direction perpendicular to the desired direction, and a ratio of the second component to the first component is 25% or smaller.

9. A near-field exposure system according to claim 8, wherein said ratio is 15% or smaller.

* * * * *